(12) United States Patent
Tripsas et al.

(10) Patent No.: US 6,735,123 B1
(45) Date of Patent: May 11, 2004

(54) HIGH DENSITY DUAL BIT FLASH MEMORY CELL WITH NON PLANAR STRUCTURE

(75) Inventors: Nicholas H. Tripsas, San Jose, CA (US); Mark T. Ramsbey, Sunnyvale, CA (US); Wei Zheng, Sunnyvale, CA (US); Effiong Ibok, Sunnyvale, CA (US); Fred T K Cheung, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 34 days.

(21) Appl. No.: 10/164,895

(22) Filed: Jun. 7, 2002

(51) Int. Cl.[7] ............................................. G11C 16/04
(52) U.S. Cl. ............................ 365/185.26; 365/185.28; 438/981
(58) Field of Search ..................... 365/185.15, 185.26, 365/185.28; 257/324, 325, 411; 438/287, 981

(56) References Cited

U.S. PATENT DOCUMENTS

| | | | | |
|---|---|---|---|---|
| 5,741,737 A | * | 4/1998 | Kachelmeier | ............... 438/286 |
| 5,859,453 A | * | 1/1999 | Ahn | ........................... 257/314 |
| 6,048,759 A | * | 4/2000 | Hshieh et al. | ............... 438/206 |
| 6,058,045 A | * | 5/2000 | Pourkeramati | ......... 365/185.17 |
| 6,225,669 B1 | * | 5/2001 | Long et al. | ................... 257/401 |
| 6,521,496 B1 | * | 2/2003 | Roy et al. | .................... 438/261 |
| 6,531,410 B2 | * | 3/2003 | Bertin et al. | ................. 438/766 |
| 2002/0163031 A1 | * | 11/2002 | Liu et al. | ..................... 257/315 |

* cited by examiner

*Primary Examiner*—Carl Whitehead, Jr.
*Assistant Examiner*—Stephen W. Smoot
(74) *Attorney, Agent, or Firm*—Renner, Otto, Boisselle & Sklar, LLP

(57) ABSTRACT

A dual bit dielectric memory cell comprises a substrate with a source region and a drain region implanted on opposing sides of a central channel region. A multilevel charge trapping dielectric is positioned on the substrate above the central channel region and includes a central region between an opposing source lateral region and a drain lateral region. A control gate is positioned above the multilevel charge trapping dielectric. The multilevel charge trapping dielectric comprises a tunnel dielectric layer adjacent the substrate, a top dielectric adjacent the control gate, and a charge trapping dielectric positioned there between. The thickness of the tunnel dielectric layer in the central region is greater than a thickness of the tunnel dielectric layer in each of the source lateral region and the drain lateral region.

7 Claims, 8 Drawing Sheets

HIGH DENSITY DUAL BIT FLASH MEMORY CELL WITH NON PLANAR STRUCTURE

TECHNICAL FIELD

The present invention relates generally to flash memory cell devices and more specifically, to improvements in fabricating a dielectric memory cell structure for dual bit storage.

BACKGROUND OF THE INVENTION

Conventional floating gate flash memory types of EEPROMs (electrically erasable programmable read only memory), utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0 eV of kinetic energy which is more than sufficient to cross the 3.2 eV Si—$SiO_2$ energy barrier between the channel region and the tunnel oxide. While the electrons are accelerated towards the drain, those electrons which collide with the crystalline lattice are re-directed towards the Si—$SiO_2$ interface under the influence of the control gate electrical field and gain sufficient energy to cross the barrier.

Once programmed, the negative charge on the floating gate increases the threshold voltage of the FET characterized by the source region, drain region, channel region, and control gate. During a "read" of the memory cell, the magnitude of the current flowing between the source and drain at a predetermined control gate voltage indicates whether the flash cell is programmed.

More recently dielectric memory cell structures have been developed. A conventional dielectric memory cell 10 is shown in cross section in FIG. 1 and is characterized by a vertical stack of an insulating tunnel dielectric layer 12, a charge trapping dielectric layer 14, an insulating top oxide layer 16, and a polysilicon control gate 18 positioned on top of a crystalline silicon substrate 15. Within the substrate 15 are a channel region 17 positioned below the vertical stack and source diffusion 19 and drain diffusion 23 on opposing sides of the channel region 17. This particular structure of a silicon channel region 17, tunnel oxide 12, nitride 14, top oxide 16, and polysilicon control gate 18 is often referred to as a SONOS device.

Similar to the floating gate device, the SONOS memory cell 10 is programmed by inducing hot electron injection from the channel region 17 to the nitride layer 14 to create a non volatile negative charge within charge traps existing in the nitride layer 14. Again, hot electron injection can be achieved by applying a drain-to-source bias along with a high positive voltage on the control gate 18. The high voltage on the control gate 18 inverts the channel region 17 while the drain-to-source bias accelerates electrons towards the drain region 23. The accelerated electrons gain 5.0 to 6.0 eV of kinetic energy which is more than sufficient to cross the 3.2 eV Si—$SiO_2$ energy barrier between the channel region 17 and the tunnel oxide 12. While the electrons are accelerated towards the drain region 23, those electrons which collide with the crystalline lattice are re-directed towards the Si—$SiO_2$ interface under the influence of the control gate electrical field and have sufficient energy to cross the barrier. Because the nitride layer stores the injected electrons within traps and is otherwise a dielectric, the trapped electrons remain localized within a drain charge storage region 13 that is close to the drain region 23 (or in a source charge storage region 11 that is close to the source region 19 if a source to drain bias is used) from which the electrons were injected. As such, the SONOS device can be used to store two bits of data, one in each of the charge storage regions 11 and 13, per cell and are typically referred to as dual bit SONOS devices.

A problem associated with hot carrier injection programming is its low injection efficiency, typically in the $10^{-6}$ range. This causes programming to be slow and to consume a large amount of power. A separate problem associated with dual bit SONOS structures is that a portion of the charge will spread into the area between the source charge storage region 11 and the drain charge storage region 13 during each program/erase cycle. The spread charge affects the threshold voltage during the read cycle. The charge that accumulates between the source charge storage region 11 and the drain charge storage region 13 is difficult to remove utilizing the hot hole injection erase mechanism. The problem is further compounded by the continued decrease in the size of the semiconductor devices, which calls for nitride layers with less area separating the two charge storage regions 11 and 13. A need exists for a process of fabricating a dual bit memory cell structure that does not suffer the disadvantages discussed above.

SUMMARY OF THE INVENTION

A first aspect of the present invention is to provide dual bit dielectric memory cell which stores a charge within a charge trapping layer that is isolated from a substrate by a tunnel dielectric and isolated from a control gate by a top dielectric layer. The substrate comprises a source region, a drain region, and a channel region positioned between the source region and the drain region. A multi level charge trapping dielectric is positioned on the surface of the substrate and a control gate is positioned on the surface of the multilevel charge trapping dielectric.

The multilevel charge trapping dielectric includes the tunnel dielectric layer adjacent to the substrate, the charge trapping layer, and the top dielectric layer. The tunnel dielectric layer includes a central region that is laterally positioned between a source lateral region and a drain lateral region. The thickness of the tunnel dielectric layer in the central region has a thickness that is greater than the thickness of the tunnel dielectric layer in each of the source lateral region and the drain lateral region.

The thickness of the tunnel dielectric layer in each of the source lateral region and the drain lateral region may be within a range of about 50 Å and 150 Å. The thickness of the tunnel dielectric layer in the central region may be within a range of about 70 Å (angstrom) and 200 Å in thickness. The charge trapping layer may have a thickness in the range from about 50 Å to 10 Å in thickness across the central region, the source lateral region, and the drain lateral region.

The charge trapping layer may be comprised of a nitride compound such as a material selected from the group consisting of $Si_3N_4$ and $SiO_xN_4$. The charge trapping layer within the source lateral region may form a source charge trapping region and the length of the source lateral region may be within a range of about 300 Å to 500 Å. Similarly, the charge trapping layer within the drain lateral region may form a drain charge trapping region and the length of drain charge trapping region may be within a range of about 300 Å to 500 Å. The length of the central region may be within a range of about 70 Å to 200 Å.

A second aspect of the present invention is to provide a method of storing data in dual bit dielectric memory cell that includes a tunnel dielectric layer having a tunnel layer with a thickness in a central region positioned between a source lateral region and a drain lateral region that is greater than a thickness in each of the source lateral region and the drain lateral region. The method comprises utilizing a source-to-drain bias in the presence of a control gate field to induce hot electron injection through a tunnel dielectric thickness that is greater than the thickness in the source lateral region and less than the thickness in the central region to inject a charge into a source charge trapping region. Similarly, the method comprises utilizing a drain-to-source bias in the presence of a control gate field to induce hot electron injection through a tunnel dielectric thickness greater than the thickness in the drain lateral region and less than the thickness in the central region to inject a charge into a drain charge trapping region.

The non-planar structure of the tunnel layer and the charge trapping layer redirects the electrical field during programming and increases the hot electron injection efficiency in the source lateral region and the drain lateral region during programming. Furthermore, the thicker central area in the tunnel dielectric reduces charge spread into the central area between the source lateral region and the drain lateral region. Further, if any charge does spread into the central region, the thickness of the tunnel dielectric within the central region will minimize its effects on the read threshold.

DESCRIPTION OF THE PREFERRED EMBODIMENTS

Figure 1:
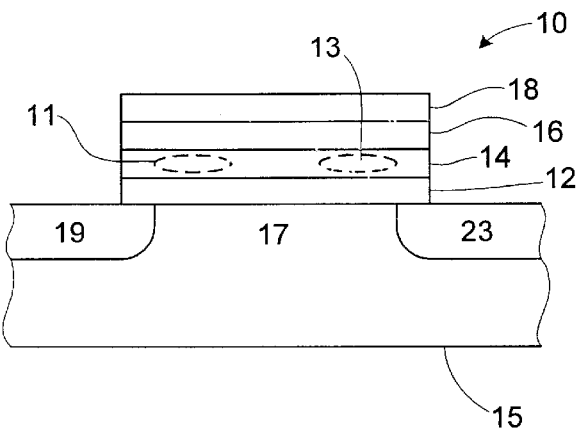
FIG. 1 is a schematic, cross sectional view of a dielectric memory cell in accordance with the prior art.

The present invention will now be described in detail with reference to the drawings. In the drawings, like reference numerals are used to refer to like elements throughout. Further, the diagrams are not drawn to scale and the dimensions of some features are intentionally drawn larger than scale for purposes of showing clarity.

Figure 2:
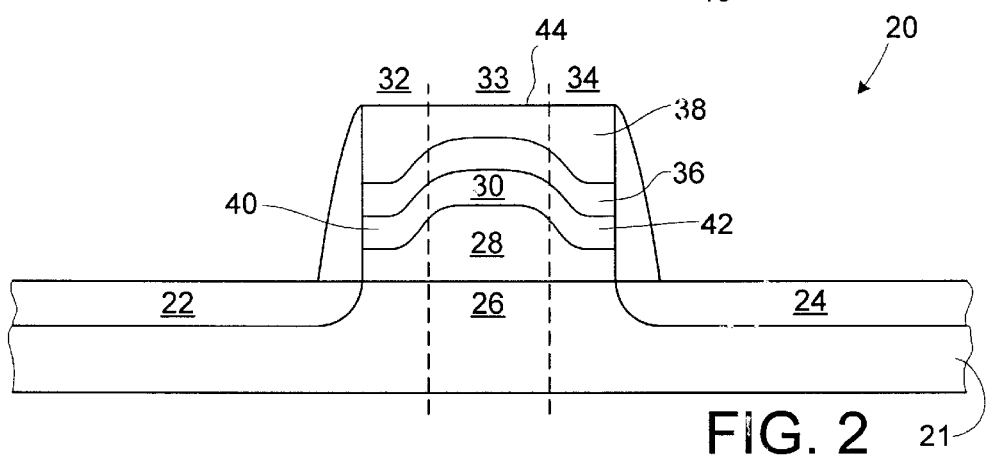
FIG. 2 is a schematic cross sectional view of a dual bit dielectric memory cell in accordance with one embodiment of this invention.

Referring to FIG. 2, an exemplary embodiment of a dual bit memory cell 20 in accordance with the present invention is shown in cross section. The dual bit memory cell 20 comprises a crystalline semiconductor substrate 21 which includes a source region 22 and a drain region 24 on opposing sides of a central channel region 26. Above the channel region 26 is a tunnel dielectric layer 28. Above the tunnel dielectric layer is a charge trapping layer 30. Above the charge trapping layer 30 is a top dielectric layer 36 and positioned above the top dielectric layer 36 is a polysilicon gate 38.

The dual bit memory cell 20 is shown as a substantially planar structure formed on the silicon substrate 21. However, it should be appreciated that the teachings of this invention may be applied to both planar, fin formed, and other dielectric memory cell structures which may be formed on suitable semiconductor substrates which include, for example, bulk silicon semiconductor substrates, silicon-on-insulator (SOI) semiconductor substrates, silicon-on-sapphire (SOS) semiconductor substrates, and semiconductor substrates formed of other materials known in the art.

In the exemplary embodiment, the silicon substrate 21 comprises lightly doped p-type crystalline silicon and source region 22 and the drain region 24 are implanted with an n-type impurity. However, it should be appreciated that a light doped n-type crystalline silicon substrate with implanted p-type impurities within the source region 22 and the drain region 24 may readily be used.

The memory cell 20 includes three regions laterally positioned between the source region 22 and the drain region 24: a source lateral region 32 adjacent to the source region 22, a drain lateral region 34 adjacent to the drain region 24, and a central region 33 positioned there between. The tunnel dielectric layer has a thickness in the central region 33 that is greater than its thickness in both the source lateral region 32 and the drain lateral region 34.

The tunnel dielectric layer 28 may be comprised of a tunnel dielectric material with a low dielectric constant (e.g. low K) such as silicon dioxide. The thickness of the tunnel dielectric layer 28 within the source lateral region 32 and the drain lateral region 34 may be within a range of about 50 Å (angstrom) to about 150 Å. An embodiment with a more narrow bracket includes a tunnel dielectric layer 28 thickness within the source lateral region 32 and the drain lateral region 34 within a range of about 60 Å to about 90 Å and even narrower yet, a thickness of about 70 Å to about 80 Å.

The thickness of the tunnel dielectric layer 28 within the central region 33 may be within a range of about 70 Å to about 200 Å.

The charge trapping layer 30 may comprise a nitride compound with dangling bonds to provide suitable charge trapping properties. In the exemplary embodiment, the nitride compound may be selected from the group consisting of $Si_3N_4$ and $SiO_xN_4$. The charge trapping layer 30 may have a thickness (between the tunnel dielectric layer 28 and the top dielectric layer 36) within a range of about 50 Å to 100 Å.

The top dielectric layer 36 may be a dielectric material with a high dielectric constant to provide improved capacitive coupling between the control gate 38 and the charge trapping dielectric layer 30. In a preferred embodiment, the material is selected from the group of $Al_2O_3$, $HfSi_xO_y$, $HfO_2$, $ZrO_2$, and $ZrSi_xO_y$ and other materials with similarly high dielectric constants. The top dielectric layer 36 has a thickness within a range of about 70 Å to 130 Å. An embodiment with a more narrow bracket includes a top dielectric layer 36 with a thickness within a range of about 80 Å to about 120 Å and even narrower yet, a top dielectric layer 205 with a thickness of about 90 Å to about 100 Å.

The control gate 38 may be comprised of implanted polysilicon or other suitable gate materials. The control gate 38 has a relatively flat upper surface 44 such that known metalization techniques may be utilized to interconnect the control gate 38 with other circuits on the substrate 21. As such, the control gate 38 has a thickness in the central region 33 that is less than its thickness in each of the source lateral region 32 and the drain lateral region 34. More specifically, the thickness of the control gate 38 within the central region 33 is less than its thickness in each of the source lateral region 32 and the drain lateral region 34 by approximately the same difference as which the thickness of the tunnel oxide layer 28 in the central region 33 is thicker than the thickness of the tunnel oxide layer 28 in each of the source lateral region 32 and the drain lateral region 34.

The dual bit memory cell 20 is programmed utilizing a hot electron injection technique. More specifically, programming of the first bit of data comprises injecting electrons into a source charge trapping region 40 which comprises the charge trapping layer 30 within the source lateral region 32. And, programming the second bit of data comprises injecting electrons into the drain charge trapping region 42 which comprises the charge trapping layer 30 with in the drain lateral region 34. Hot electron injection into the source charge trapping region 40 comprises applying a source-to-drain bias while applying a high voltage to the control gate 38 which provides sufficient field for electrons to tunnel through a tunnel oxide layer 28 thickness that is equal to or greater than the thickness of tunnel oxide layer 28 within the source lateral region 32 and less than the thickness of the tunnel dielectric layer 28 within the central region 33.

In the exemplary embodiment, this may be accomplished by grounding the drain region 24 and applying approximately 5V to the source region 22 and approximately 10V to the control gate 38. The voltage on the control gate 38 inverts the channel region 26 while source-to-drain bias accelerates electrons from the source region 22 into the channel region 26 towards the drain region 24. The 4.5 eV to 5 eV kinetic energy gain of the electrons is more than sufficient to surmount the 3.1 eV to 3.5 eV energy barrier at channel region 26/tunnel dielectric layer 28 interface and, while the electrons are accelerated towards drain region 24, the field caused by the high voltage on control gate 38 redirects the electrons, towards the source charge trapping region 40. Those electrons that cross the interface into source charge trapping region 40 remain trapped for later reading.

Similarly, programming the second bit of data by hot electron injection into the drain charge trapping region 42 comprises applying a drain-to-source bias while applying a high voltage to the control gate 38. Similar to as described above, this may be accomplished by grounding the source region 22 and applying approximately 5V to the drain region 24 and approximately 10V to the control gate 38. The voltage on the control gate 38 inverts the channel region 26 while the drain-to-source bias accelerates electrons from the drain region 24 into the channel region 26 towards the source region 22. The field caused by the high voltage on control gate 38 redirects the electrons towards the drain charge trapping region 42. Those electrons that cross the interface into drain charge trapping region 42 remain trapped for later reading.

The presence of trapped electrons within each of the source charge trapping region 40 and the drain charge trapping region 42 effect depletion within the channel region 26 and as such effect the threshold voltage of a field effect transistor (FET) characterized by the control gate 38, the source region 22, and the drain region 24. Therefore, each bit of the dual bit memory cell 20 may be "read", or more specifically, the presence of electrons stored within each of the source charge trapping region 40 and the drain charge trapping region 42 may be detected by operation of the FET. In particular, the presence of electrons stored within the source charge trapping region 40 may be detected by applying a positive voltage to the control gate 38 and a lesser positive voltage to the drain region 22 while the source region grounded. The current flow is then measured at the drain region 24. Assuming proper voltages and thresholds for measurement, if there are electrons trapped within the source charge trapping region 40, no current (or at least no current above a threshold) will be measured at the drain region 24. Otherwise, if the source charge trapping region 40 is charge neutral (e.g., no trapped electrons) then there will be a measurable current flow into drain region 24. Similarly, the presence of electrons stored within the drain charge trapping region 42 may be detected by the same method, and merely reversing the source region 22 and drain region 24 for voltage and ground.

It should be appreciated that because the source charge trapping region 40 and the drain charge trapping region 42 are separated by the portion of the charge trapping layer 30 within the central region 33, little charge, if any, will spread into the area between the source charge trapping region 40 and the drain charge trapping region 42. And, if some charge does spread into such region, the thickness of the tunnel dielectric layer 28 within the central region 33 will prevent such charge from effecting read thresholds.

Figure 3A:
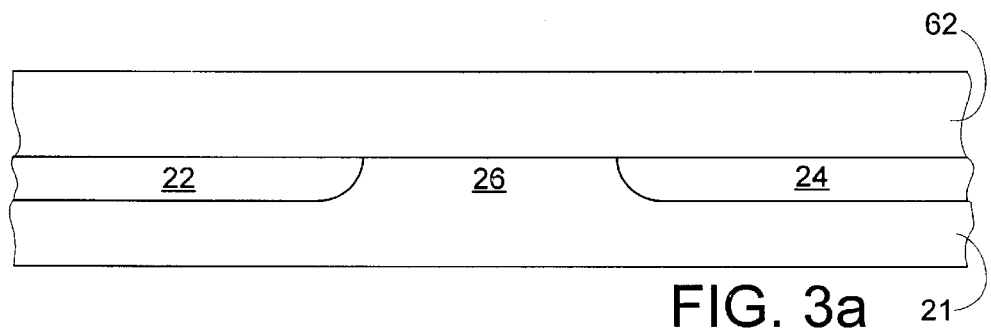
FIGS. 3a–3f each show a schematic cross sectional view of a processing step in a first exemplary fabrication process for the fabrication of the dual bit dielectric memory cell of FIG. 2.
Figure 3B:
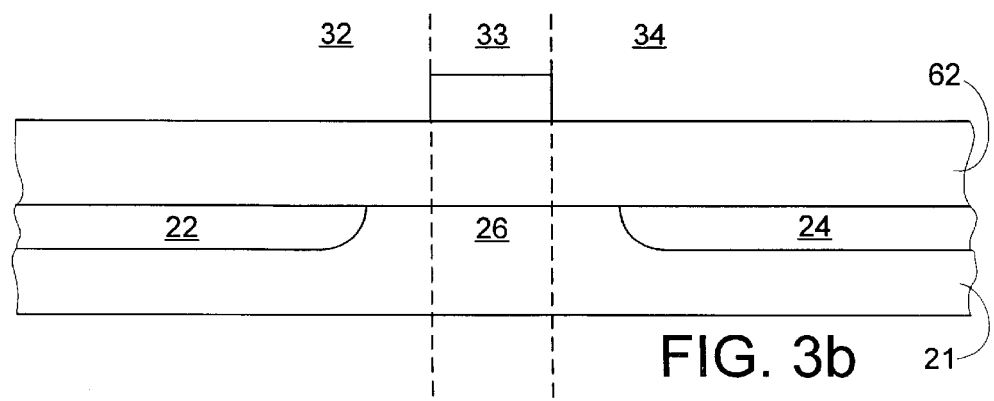
Figure 3C:
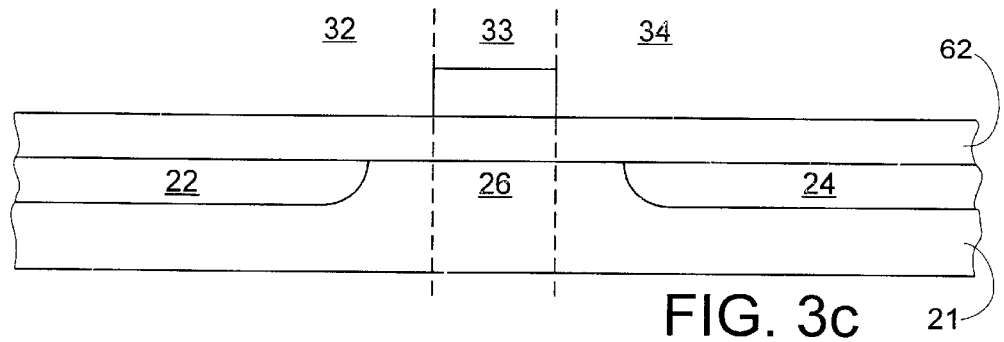
Figure 3D:
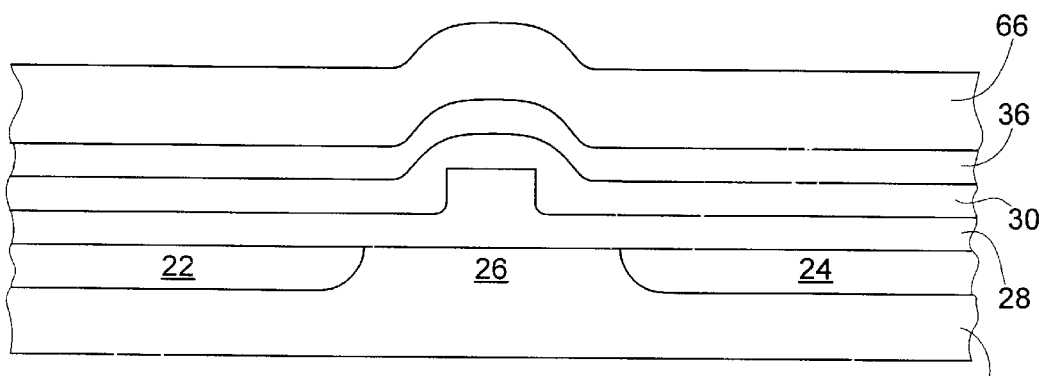
Figure 3E:
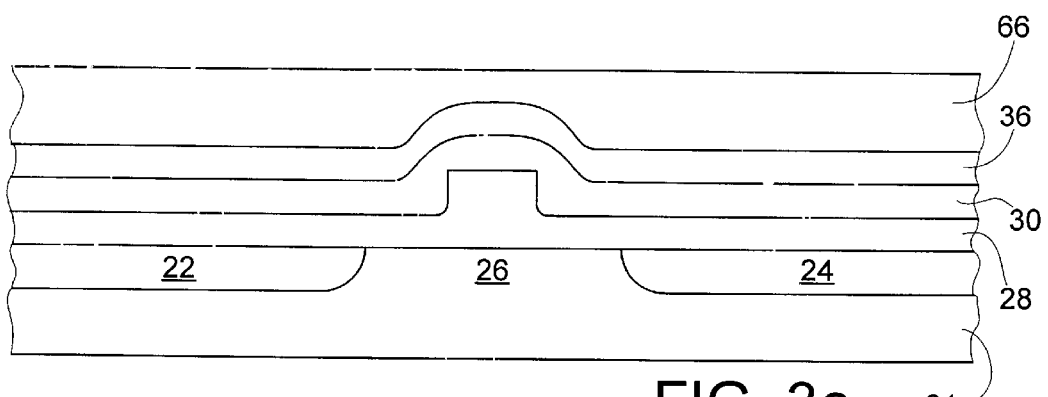
Figure 3F:
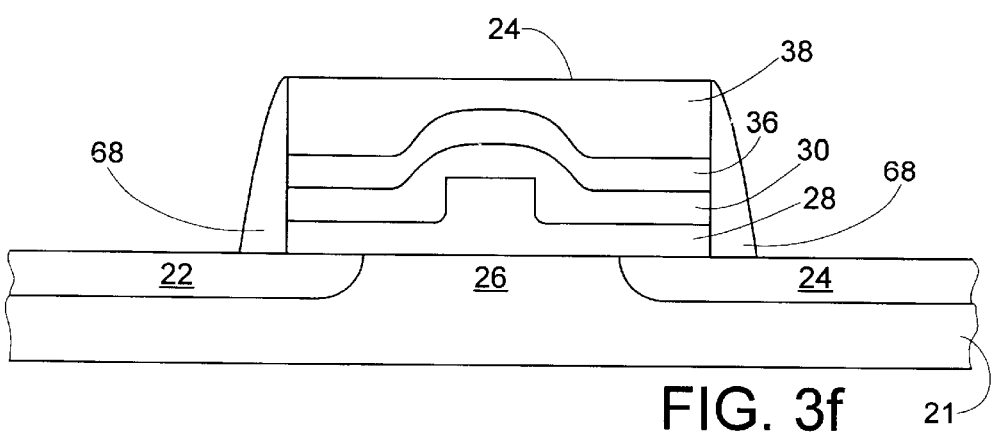
Figure 4:
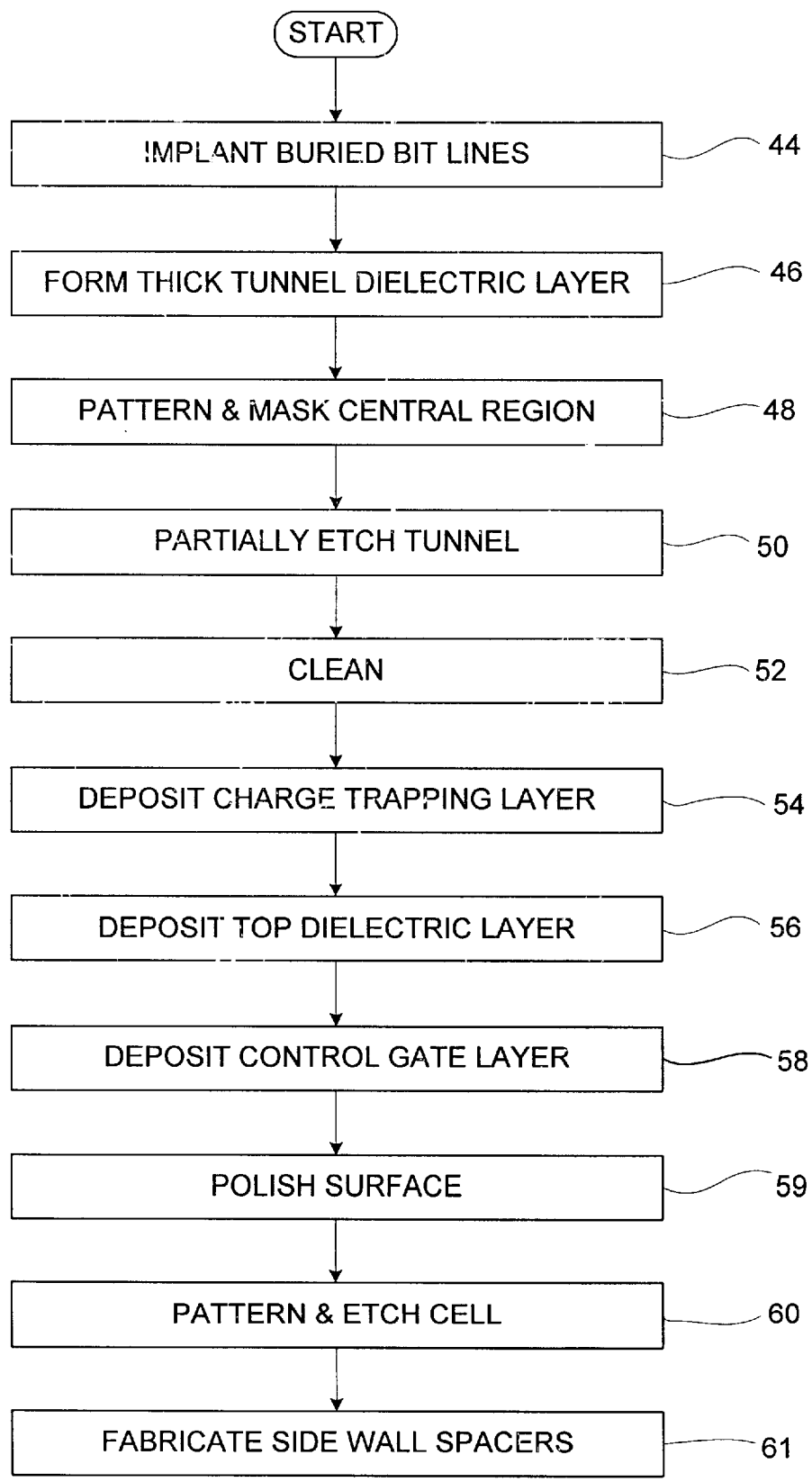
FIG. 4 is a flow chart showing exemplary steps in a first exemplary fabrication process for the fabrication of the dual bit dielectric memory cell of FIG. 2.

A first of two exemplary processes for fabricating the dual bit memory cell 20 on a crystalline silicon substrate is represented by the flowchart of FIG. 4 and the cross section diagrams of FIGS. 3a–3f. Step 44 represents implanting buried bit lines (e.g. source region 22 and drain region 24) within the substrate 21. Thereafter, steps 46 through 61 represent substeps of fabricating a layered island on the surface of the substrate 21 over the channel region 26 that is positioned between the source region 22 and the drain region 24.

More specifically, step 46 represents depositing a thick tunnel dielectric layer 62 on the surface of the crystalline silicon substrate 21. The thick tunnel dielectric layer 62 may be oxide grown to a thickness that corresponds to the thickness of tunnel dielectric layer 28 (FIG. 1) in the central region as is shown in FIG. 3a. In the exemplary embodiment, the thickness may be within a range of 200 Å to 600 Å.

Step 48 represents patterning and masking the central region 33 and exposing the source lateral region 32 and the drain lateral region 34 as is shown in FIG. 3b.

More specifically, a thin nitride antireflective coating and a photoresist mask may be applied to the surface of the thick tunnel dielectric layer 62 to define and cover the central region 34 utilizing conventional photolithography techniques.

Step 50 represents partially etching the thick tunnel dielectric layer 62 using an anisotropic etch process to reduce the thickness of the thick tunnel dielectric layer 62 within the source lateral region 32 and the drain lateral region 34 as is shown in FIG. 3c. The thickness is reduced such that the remaining thickness of the thick tunnel dielectric layer 62 within the source lateral region and the drain lateral region is a thickness that corresponds to the thickness of tunnel dielectric 28 in such regions.

Step 52 represents cleaning the remaining mask and nitride from the surface of the thick tunnel dielectric layer 62 layer utilizing HF to strip the nitride and etch the oxide surface as is shown in FIG. 3c.

Step 54 represents depositing the charge trapping layer 30 on the surface of the tunnel dielectric layer 28, step 56 represents depositing the top dielectric layer 36 on the surface of the charge trapping layer 30, and step 58 represents depositing a control gate layer 66 on the surface of the top dielectric layer 36 as is shown in FIG. 3d. Steps 54, 56 and 58 may each be performed utilizing a low pressure chemical vapor deposition (LPGVD) process, a rapid thermal chemical vapor deposition (RTCVD) process, or a plasma enhanced chemical vapor deposition (PECVD) process.

As discussed, the surface of the control gate 38 should be relatively flat, as such, step 59 represents polishing the surface of the control gate layer 66 as is shown in FIG. 3e.

Step 60 represents patterning and etching the control gate layer 66. More specifically, an antireflective coating and a mask may be applied to the surface of the control gate layer 66 to define and cover the control gate 38 utilizing conventional photolithography techniques. An anisotropic etch process may be used to etch the exposed regions of the polysilicon control gate layer 66, the top dielectric layer 36, the charge trapping layer 30, and the tunnel dielectric layer 28 to form the layered island 29 as is shown in FIG. 3f. In the exemplary embodiment, the length of the layered island 29 is a length such that each of the source lateral region 32 and the drain lateral region may have a length within the range of about 300 Å to 500 Å and the central region has a length within a range of about 300 Å to 2500 Å.

Step 61 represents fabricating side wall spacers 68 by depositing a nitride layer (or another suitable dielectric material) over the surface of the wafer using an LPCVD process and performing an isotropic dry plasma etch process to remove the nitride compound from horizontal surfaces leaving the spacers 68.

Figure 5A:
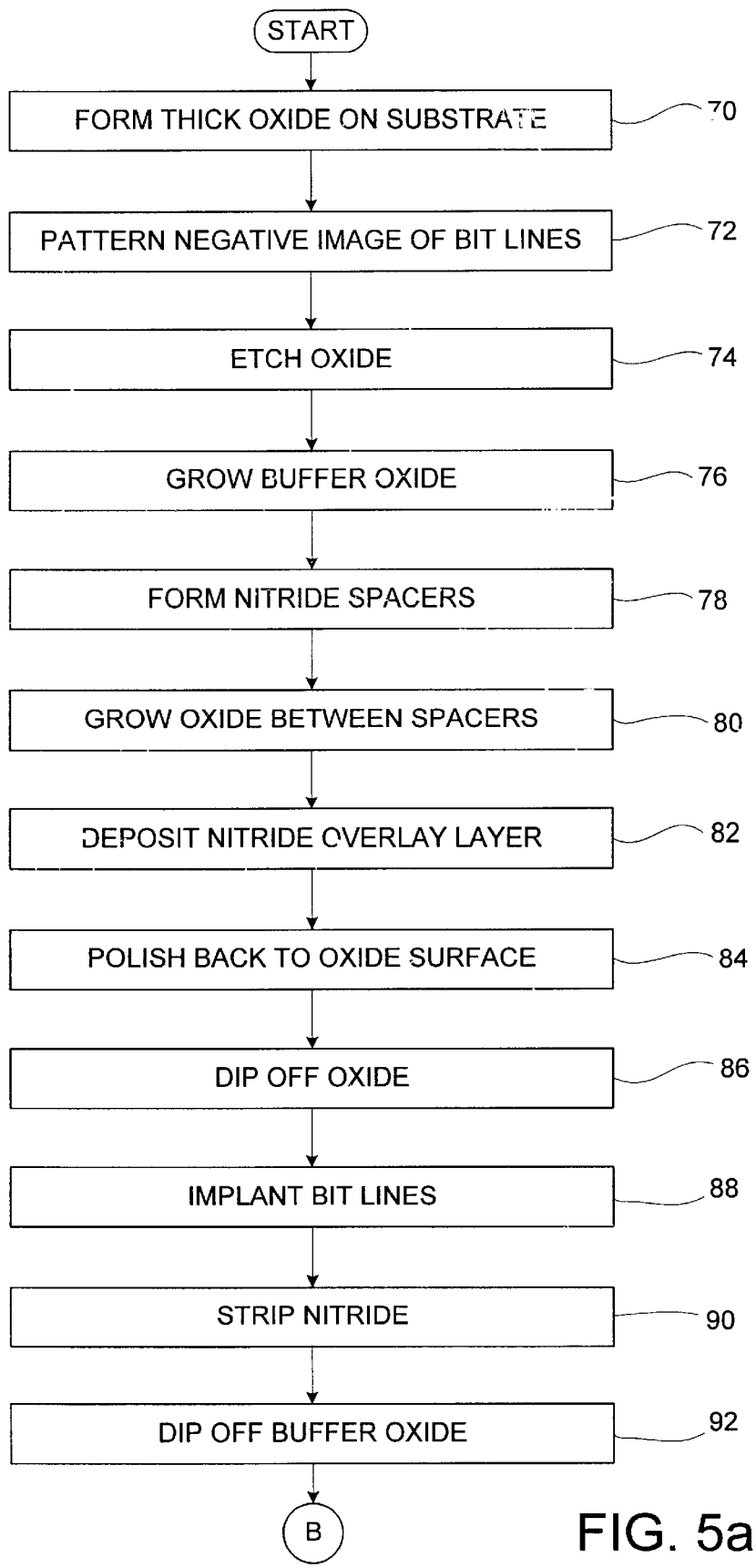
FIGS. 5a and 5b are a flow chart showing exemplary steps in a second exemplary fabrication process for the fabrication of the dual bit dielectric memory cell of FIG. 2.
Figure 5B:
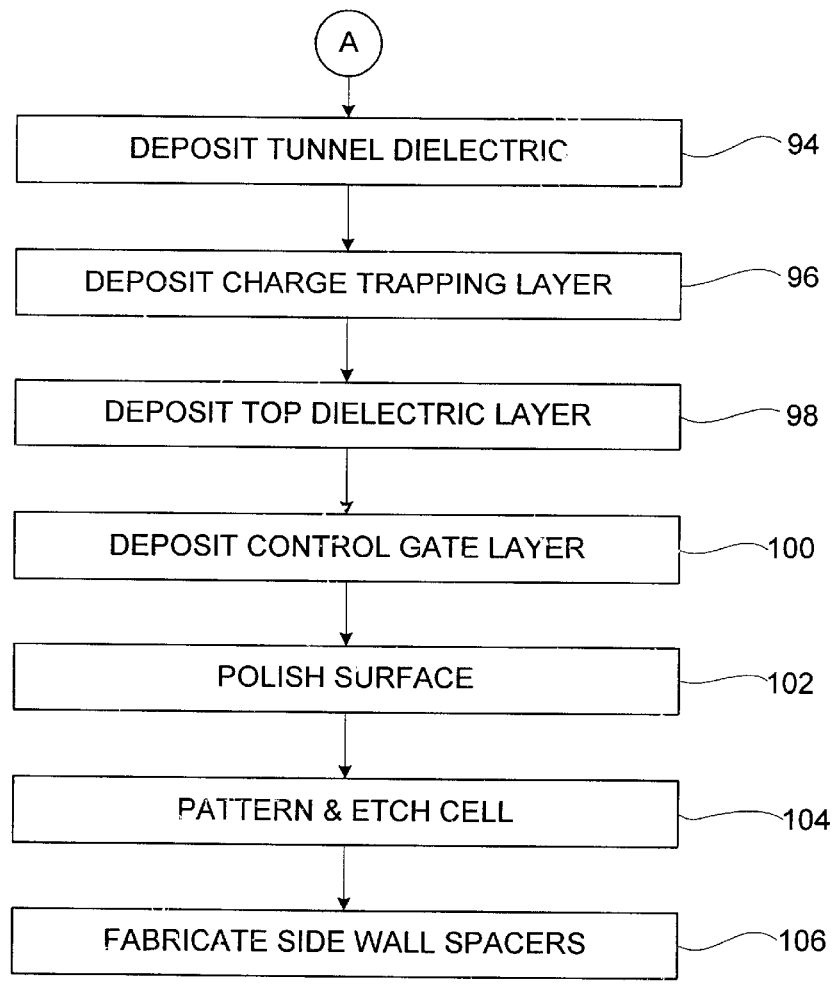
Figure 6A:
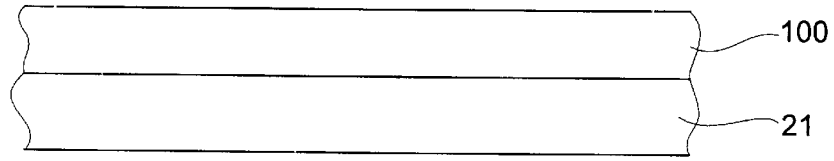
FIGS. 6a–6o each show a schematic cross sectional view of a processing step in a second exemplary fabrication process for the fabrication of the dual bit dielectric memory cell of FIG. 2.
Figure 6B:
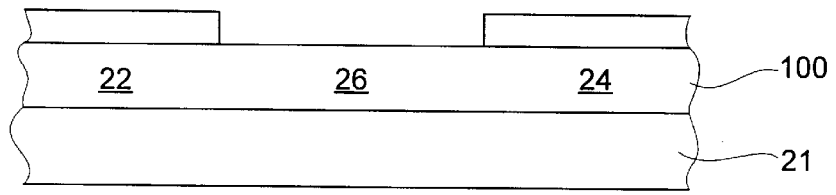
Figure 6C:
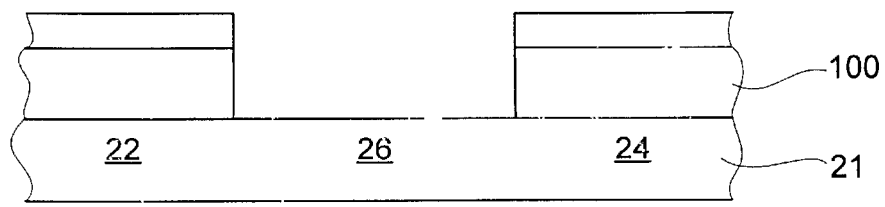
Figure 6D:
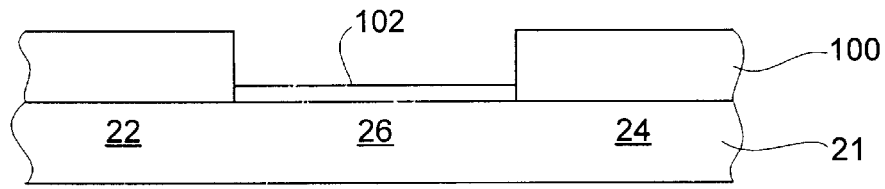
Figure 6E:
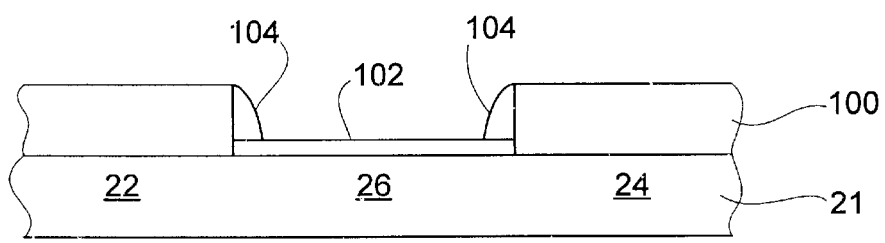
Figure 6F:
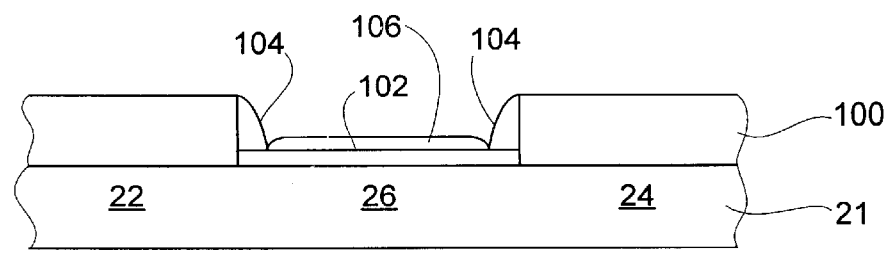
Figure 6G:
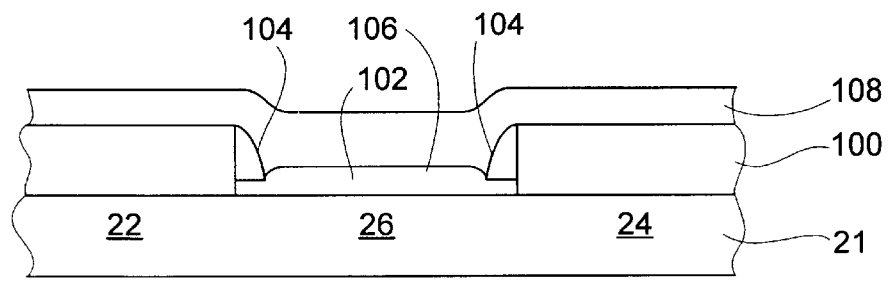
Figure 6H:
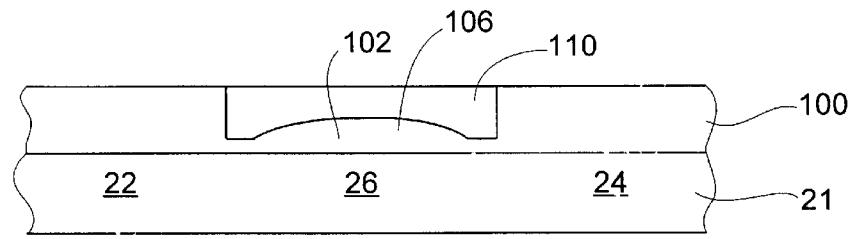
Figure 6I:
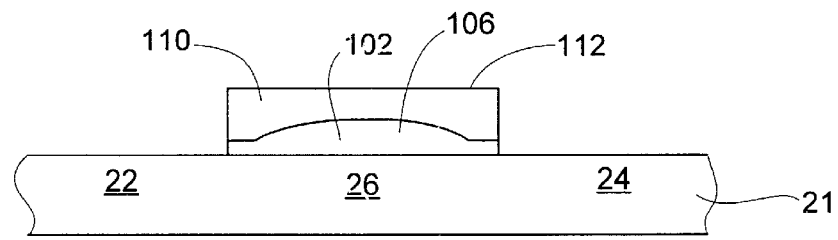
Figure 6J:
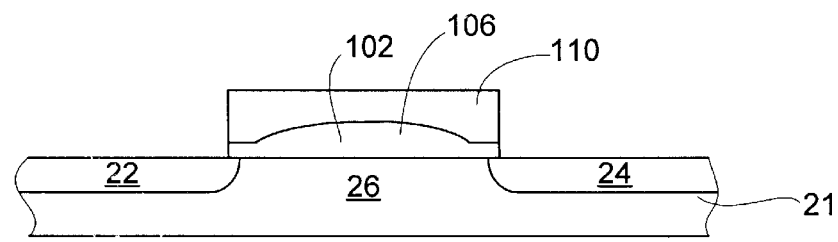
Figure 6K:
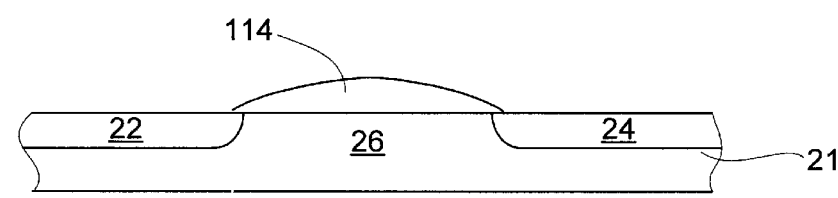
Figure 6L:
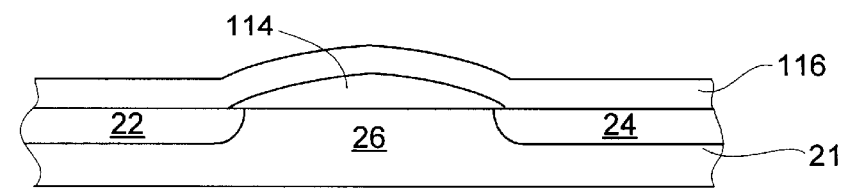
Figure 6M:
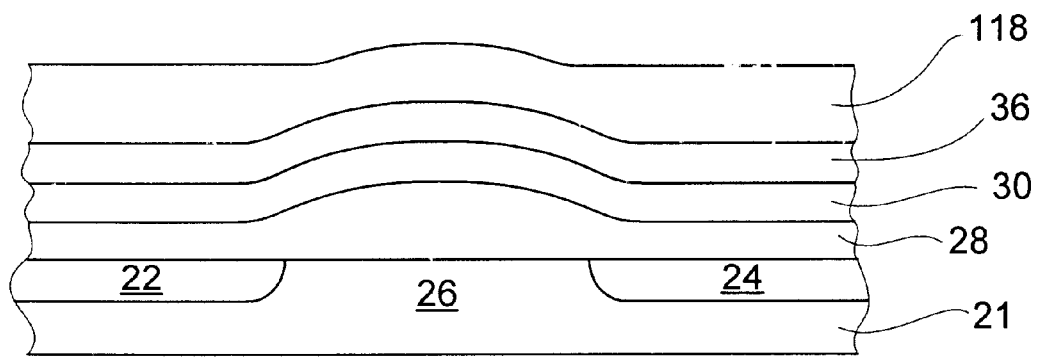
Figure 6N:
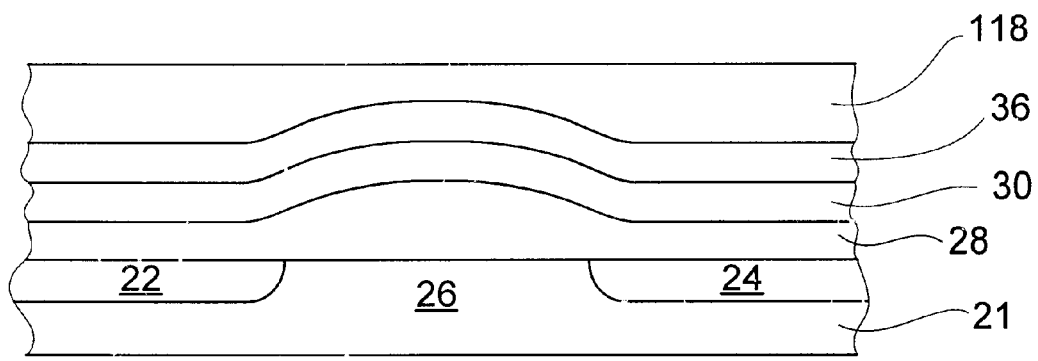
Figure 6O:
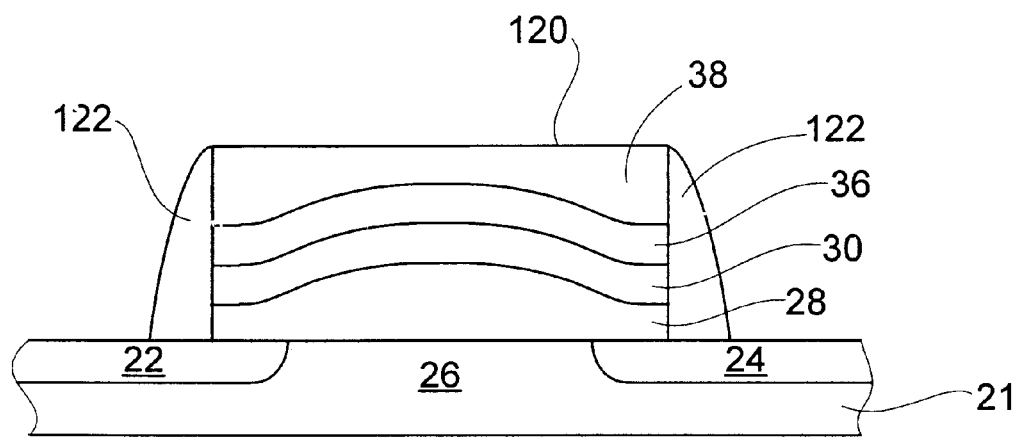

A second of the two exemplary processes for fabricating the dual bit memory cell 20 on a crystalline silicon substrate is represented by the flowchart of FIGS. 5a and 5b in combination with the cross section diagrams of FIGS. 6a–6o.

Step 70 represents forming a thick oxide layer 100 on the surface of the substrate 21 as is shown in FIG. 6a. In the exemplary embodiment, the thick oxide layer 100 may be grown or deposited to a thickness within a range of about 2000 Å to 6000 Å.

Step 72 represents patterning and masking the regions of the wafer that are to be the bit lines (e.g. source region 22 and drain region 24) and exposing the channel region 26 as is shown in FIG. 6b. A thin nitride antireflective coating and a photoresist mask may be applied to the surface of the thick oxide layer 100 to define and expose the channel region 26 utilizing conventional photolithography techniques.

Step 74 represents etching the thick oxide layer 100 using an anisotropic etch process to remove the oxide over the channel region 26 as is shown in FIG. 6c.

Step 76 represents growing a thin buffer oxide layer 102 over the surface of the exposed substrate in the channel region 26 as is shown in FIG. 6d. In the exemplary embodiment, the thin buffer oxide layer 102 is grown to a thickness within a range of about 20 Å to 50 Å.

Step 78 represents forming nitride sidewall spacers 104 on the sides of the remaining thick oxide layer 100 as is shown in FIG. 6e. More specifically, a layer of nitride or silicon oxynitride with a thickness within the a range of about 500 Å to 3000 Å is deposited on the surface using a LPCVD or PECVD process and etched back to expose the oxide on horizontal surfaces while leaving the side wall spacers 104 adjacent to the vertical surfaces.

Step 80 represents growing an additional oxide layer 106 across the oxide layer 102 as is shown in FIG. 6f. In the exemplary embodiment, the additional oxide layer 106 is grown to a thickness within a range of about 30 Å to 100 Å.

Step 82 represents depositing a nitride or silicon oxynitride overlay layer 108 across the entire surface utilizing a LPCVD or PECVD process as is shown in FIG. 6g. The thickness of the layer 108 is adequate to fill the void in above the channel region 26 and in the exemplary embodiment may be a thickness within a range of about 500 Å to 3000 Å.

Step 84 represents polishing the nitride overlay layer 108 back to expose the oxide layer 100 above the source region 22 and the drain region 24 and leaving a nitride well 110 of nitride over oxide layers 102 and 106 above the channel region as is shown in FIG. 6h.

Step 86 represents wet cleaning the wafer to remove the exposed oxide and leaving an island 112 above the channel region 26 (comprised of the oxide layers 102 and 106 and nitride well 110) and exposing the source region 22 and the drain region 24 of the substrate 21 as is shown in FIG. 6i.

Step 88 represents implanting the bit lines (e.g. source region 22 and drain region 24) as is shown in FIG. 6j. Step 90 represents striping the nitride 110 and step 92 represents wet cleaning the wafer to remove a thin layer of oxide (e.g. remove the portions of the oxide layer 102 that is not covered by the oxide layer 106). In the exemplary embodiment, a mound of oxide 114 remains on the surface of the substrate above the channel region 26 as is shown in FIG. 6k.

Step 94 represents depositing a tunnel dielectric layer 116 over the surface of the substrate 21 and the mound 114 as is shown in FIG. 6l. The thickness of the tunnel dielectric layer 116 corresponds to the thickness of the tunnel dielectric layer 38 within the source lateral region 32 and the drain lateral region 34 (all of FIG. 2), which in the exemplary embodiment is a thickness within a range of about 60 Å to 90 Å. The mound 114 and the tunnel dielectric layer 116 together form the tunnel dielectric layer 38.

Step 96 depositing the charge trapping layer 30 on the surface of the tunnel dielectric layer 28, step 98 represents depositing the top dielectric layer 36 on the surface of the charge trapping layer 30, and step 100 represents depositing a control gate layer 118 on the surface of the top dielectric layer 36 as is shown in FIG. 6m. Steps 96, 98, and 100 may each be performed utilizing a LPCVD, a RTCVD, or a PECVD process.

Step 102 represents polishing the surface of the control gate layer 118 as is shown in FIG. 6n and step 104 represents patterning and etching the control gate layer 118 to form island 120 as shown in FIG. 6o. More specifically, an antireflective coating and a mask may be applied to the surface of the control gate layer 118 to define and cover the control gate 38 utilizing conventional photolithography techniques. An anisotropic etch process may be used to etch the exposed regions of the polysilicon control gate layer 118, the top dielectric layer 36, the charge trapping layer 30, and the tunnel dielectric layer 28 to form the island 120.

Step 106 represents fabricating side wall spacers 122 by depositing a nitride layer (or another suitable dielectric material) over the surface of the wafer using an LPCVD process and performing an isotropic dry plasma etch process to remove the nitride compound from horizontal surfaces leaving the spacers 122.

In summary, the dual bit dielectric memory cell of this invention provides for fabrication of a smaller cell without enabling spreading of charge between a source charge trapping region and a drain charge trapping region. Although the dielectric memory cell of this invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A method of storing data in dual bit dielectric memory cell that includes a tunnel dielectric layer having a tunnel dielectric layer with a thickness in a central region positioned between a source lateral region and a drain lateral region that is greater than a thickness in each of the source lateral region and the drain lateral region, and a continuous charge trapping layer overlying the tunnel dielectric layer, the method comprising:

a) utilizing a source-to-drain bias in the presence of a control gate field to induce hot electron injection through a tunnel dielectric thickness greater than the thickness in the source lateral region and less than the thickness in the central region to inject a charge into a source charge trapping region within the charge trapping layer; and b) utilizing a drain-to-source bias in the presence of a control gate field to induce hot electron injection through a tunnel dielectric thickness greater than the thickness in the drain lateral region and less than the thickness in the central region to inject a charge into a drain charge trapping region within the charge trapping layer.

2. The method of claim 1, wherein the step of utilizing a source-to-drain bias in the presence of a control gate field to inject a charge into a source charge trapping region includes injecting a charge into a source charge trapping region comprising a nitride compound, and the step of utilizing a drain-to-source bias in the presence of a control gate field to inject a charge into a drain charge trapping region includes injecting a charge into a drain charge trapping region comprising the nitride compound.

3. The method of claim 2, wherein the step of utilizing a source-to-drain bias in the presence of a control gate field to inject a charge into a source charge trapping region includes injecting a charge into a source charge trapping region comprising a material selected from the group consisting of $Si_3N_4$ and $SiO_xN_4$, and the step of utilizing a drain-to-source bias in the presence of a control gate field to inject a charge into a drain charge trapping region includes injecting a charge into a drain charge trapping region comprising the material.

4. The method of claim 3, wherein the step of utilizing a source-to-drain bias in the presence of a control gate field to inject a charge into a source charge trapping region includes injecting a charge into a source charge trapping region that extends from about 300 Å to about 500 Å over a central channel region, and the step of utilizing a drain-to-source bias in the presence of a control gate field to inject a charge into a drain charge trapping region includes injecting a charge into a drain charge trapping region that extends from about 300 Å to about 500 Å over the central channel region.

5. A method of storing data in dual bit dielectric memory cell that includes a tunnel dielectric layer having a tunnel dielectric layer with a thickness in a central region positioned between a source lateral region and a drain lateral region that is greater then a thickness in each of the source lateral region and the drain lateral region, the method comprising:

a) utilizing a source-to-drain bias in the presence of a control gate field to induce hot electron injection through a tunnel dielectric thickness greater than the thickness in the source lateral region and less than the thickness in the central region to inject a charge into a source charge trapping region; and b) utilizing a drain-to-source bias in the presence of a control date field to induce hot electron injection through a tunnel dielectric thickness greater than the thickness in the drain lateral region and less than the thickness in the central region to inject a charge into a drain charge trapping region, wherein the step of utilizing a source-to-drain bias in the presence of a control gate field to inject a charge into a source charge trapping region includes injecting a charge into a source charge trapping region comprising a nitride compound, and the step of utilizing a drain-to-source bias in the presence of a control gate field to inject a charge into a drain charge trapping region includes injecting a charge into a drain charge-trapping region comprising the nitride compound.

6. The method of claim 5, wherein the step of utilizing a source-to-drain bias in the presence of a control gate field to inject a charge into a source charge trapping region includes injecting a charge into a source charge trapping region comprising a material selected from the group consisting of $Si_3N_4$ and $SiO_xN_4$, and the step of utilizing a drain-to-source bias in the presence of a control gate field to inject a charge into a drain charge trapping region includes injecting a charge into a drain charge trapping region comprising the material.

7. The method of claim 6, wherein the step of utilizing a source-to-drain bias in the presence of a control gate field to inject a charge into a source charge trapping region includes injecting a charge into a source charge trapping region that extends from about 300 Å to about 500 Å over a central channel region, and the step of utilizing a drain-to-source bias in the presence of a control gate field to inject a charge into a drain charge trapping region includes injecting a charge into a drain charge trapping region that extends from about 300 Å to about 500 Å over the central channel region.

* * * * *

UNITED STATES PATENT AND TRADEMARK OFFICE
CERTIFICATE OF CORRECTION

PATENT NO.    : 6,735,123 B1
DATED         : May 11, 2004
INVENTOR(S)   : Tripsas et al.

It is certified that error appears in the above-identified patent and that said Letters Patent is hereby corrected as shown below:

Drawings,
Sheet 2, Fig. 3f, the reference numeral 29 should be applied to refer to the layered island.

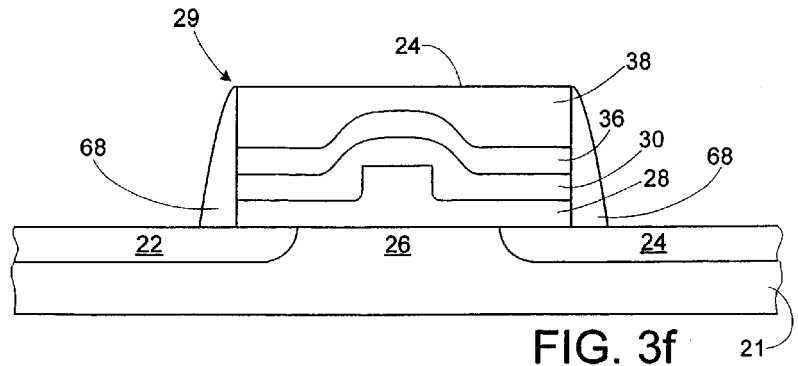

Column 2,
Line 64, replace "10" with -- 100 --.

Column 7,
Line 16, replace "(LPGVD)" with -- (LPCVD) --.

Signed and Sealed this

Tenth Day of August, 2004

JON W. DUDAS
*Acting Director of the United States Patent and Trademark Office*